United States Patent
Romanovskyy (10) Patent No.: US 9,515,640 B2
(45) Date of Patent: Dec. 6, 2016

(54) APPARATUSES AND DEVICES FOR BIAS LEVEL CORRECTION

(71) Applicant: Taiwan Semiconductor Manufacturing Company Limited, Hsinchu (TW)

(72) Inventor: Sergiy Romanovskyy, Ottawa (CA)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 23 days.

(21) Appl. No.: 14/600,439

(22) Filed: Jan. 20, 2015

(65) Prior Publication Data

US 2016/0211834 A1  Jul. 21, 2016

(51) Int. Cl.
*H03K 3/017* (2006.01)
*H03K 5/08* (2006.01)
*H03K 19/003* (2006.01)

(52) U.S. Cl.
CPC ............ *H03K 5/08* (2013.01); *H03K 3/017* (2013.01); *H03K 19/00361* (2013.01)

(58) Field of Classification Search
None
See application file for complete search history.

(56) References Cited

U.S. PATENT DOCUMENTS

2009/0033440 A1* 2/2009 Masuda ............... H03H 11/42
333/215

* cited by examiner

*Primary Examiner* — Cassandra Cox
(74) *Attorney, Agent, or Firm* — Jones Day (57) ABSTRACT

Apparatuses and devices are provided for bias level correction. An example apparatus includes: a bias-voltage generator configured to generate a bias voltage; a first transmission component configured to receive the bias voltage and generate a first output signal based at least in part on the bias voltage and one or more first data signals; and a first bias-level correction component configured to generate one or more first pulses based at least in part on the one or more first data signals to suppress one or more ripples associated with the bias voltage.

20 Claims, 11 Drawing Sheets

APPARATUSES AND DEVICES FOR BIAS LEVEL CORRECTION

BACKGROUND

The technology described in this disclosure relates generally to integrated circuits and more particularly to voltage level regulation.

In various fields of semiconductor technology (e.g., memories, microprocessors, complex programmable logic devices, etc.), more and more devices have been designed with core circuitry that operates at low power supply voltages. However, the core circuitry has to interface with other circuitry that operates at higher voltage levels. For example, in a double-date-rate (DDR) memory device, a power supply voltage for an input/output (IO) block is often larger than operating voltages for core or logic transistors to achieve a target bit rate with sufficient signal integrity. Many designs have been implemented to translate the voltages at circuitry interfaces from one level to another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
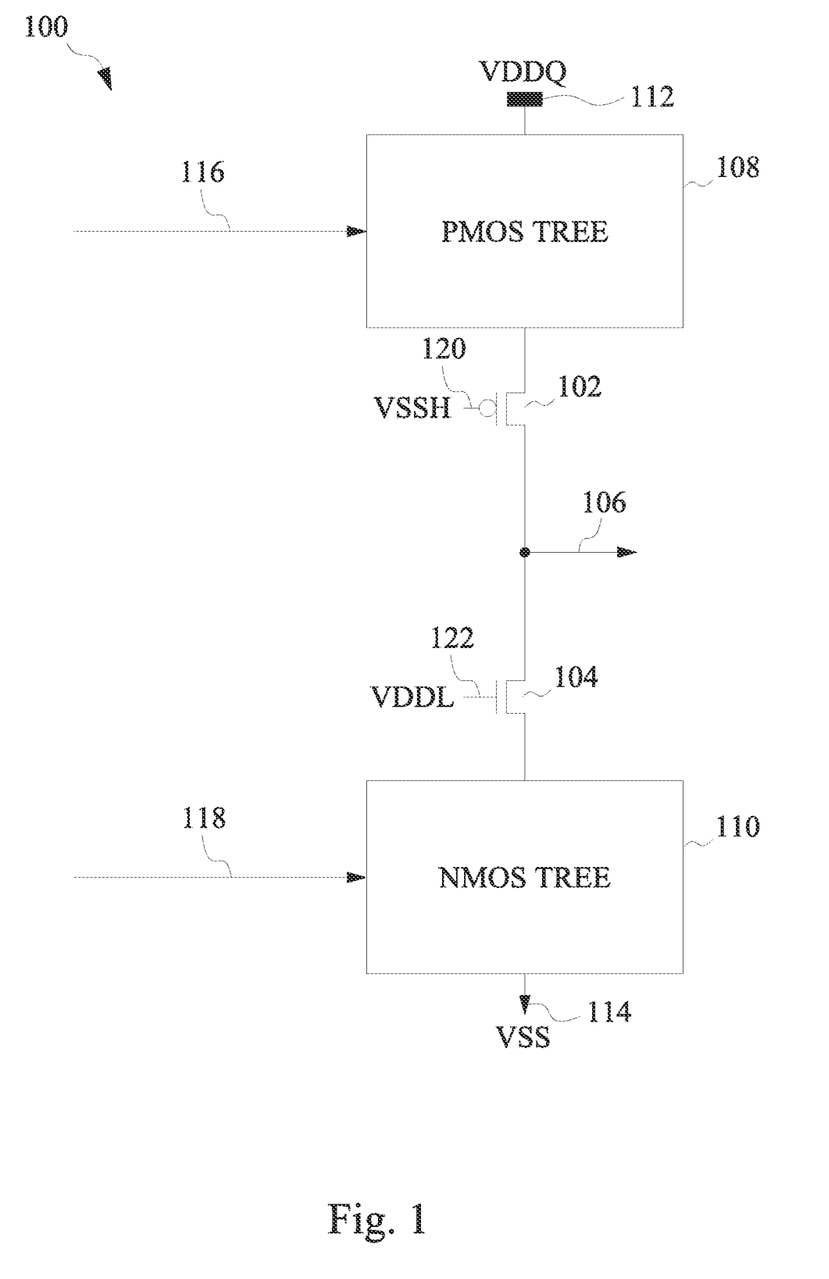
FIG. 1 depicts an example diagram of a cascode scheme, in accordance with some embodiments.

To use core circuitry with low power supply voltages in IO blocks (e.g., in a transmitter) where much higher voltages may be applied, a cascode scheme may be used to prevent transistors in the core circuitry from suffering high voltage stress. For example, cascoded transistors may be inserted in series with other transistors to drive the IO nodes (e.g., pads). FIG. 1 depicts an example diagram of a cascode scheme, in accordance with some embodiments. As shown in FIG. 1, a P-type transistor 102 and a N-type transistor 104 connected in cascode are inserted between a P-type transistor network 108 (e.g., a PMOS Tree) and a N-type transistor network 110 (e.g., an NMOS Tree) to provide an output signal 106. Two power supply voltages 112 (e.g., VDDQ) and 114 (e.g., VSS) are applied to the transistor networks 108 and 110 respectively. For example, the power supply voltage 112 is larger than a core supply voltage (e.g., VDD) but smaller than twice the core supply voltage (e.g., 2×VDD). A bias voltage 120 (e.g., VSSH) is applied as a gate voltage for the transistor 102, and a logic supply voltage 122 (e.g., VDDL) is applied as a gate voltage for the transistor 104. Input signals 116 and 118 are provided to the transistor networks 108 and 110 respectively.

The bias voltage 120 (e.g., VSSH) needs to be accurately kept at a special level, e.g., to avoid overstress of the gate insulator of the transistor 102. For example, the input signal 116 is within a range between the bias voltage 120 (e.g., VSSH) and the power supply voltage 112 (e.g., VDDQ), and the input signal 118 is within a range between the power supply voltage 114 (e.g., VSS) and the core supply voltage (e.g., VDD). The bias voltage 120 (e.g., VSSH) is kept to be equal in magnitude to a difference between the power supply voltage 112 (e.g., VDDQ) and the core supply voltage (e.g., VDD), so that the gate-source voltage drop and/or the gate-drain voltage drop of the transistor 102 may not exceed the core supply voltage. For similar reasons, the logic supply voltage 122 (e.g., VDDL) is kept to be equal to the core supply voltage (e.g., VDD). The output signal 106 is within a range between the power supply voltage 114 (e.g., VSS) and the power supply voltage 112 (e.g., VDDQ). As such, a large voltage swing of the output signal 106 can be achieved using the cascode scheme. For example, the core supply voltage (e.g., VDD) is equal to 0.8 V, and the maximum gate-source voltage drop/gate-drain voltage drop corresponds to 0.88 V. The logic supply voltage 122 (e.g., VDDL) is set to 0.8 V, and the bias voltage 120 (e.g., VSSH) is set to 0.4 V.

Usually, a single bias generator is shared among multiple IO blocks for generating bias voltages to reduce area penalty, but such sharing often causes large kick-back noises that may affect the bias level. For example, ripples may appear in the bias voltage 120, depending on the input data pattern of a corresponding IO block.

Figure 2:
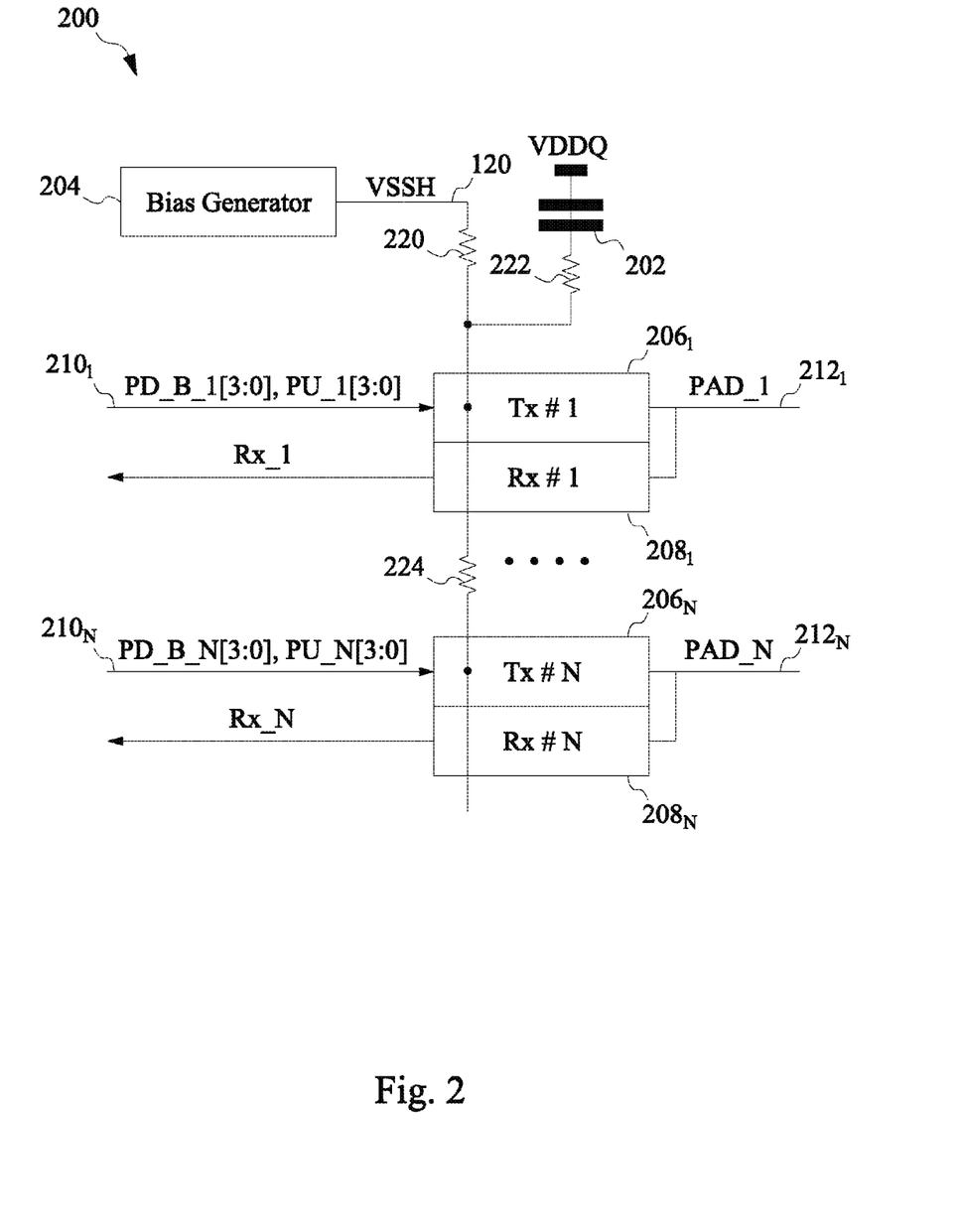
FIG. 2 depicts an example diagram of a bias generator within an IO block, in accordance with some embodiments.

FIG. 2 depicts an example diagram of a bias generator within an IO block, in accordance with some embodiments. As shown in FIG. 2, a ripple suppressor 202 (e.g., a low-dropout voltage-down converter, a chopper regulator, etc.) is implemented to reduce potential ripples in the bias voltage 120 (e.g., VSSH) generated by the bias generator 204. Specifically, the IO block 200 includes multiple transmitters $206_1, \ldots, 206_N$ (e.g., N is an integer) and multiple receivers $208_1, \ldots, 208_N$. The bias voltage 120 (e.g., VSSH) is provided to the transmitters $206_1, \ldots, 206_N$. For example, each transmitter includes cascoded devices and transistor networks (e.g., as shown in FIG. 1).

As shown in FIG. 2, the transmitters $206_1, \ldots, 206_N$ receive input data $210_1, \ldots, 210_N$ and generate output signals $212_1, \ldots, 212_N$, respectively. For example, the input data $210_1$ includes a pull-up data signal (e.g., PU_1[3:0]) and a pull-down data signal (e.g., PD_B_1[3:0]). When the pull-up data signal (e.g., PU_1[3:0]) and the pull-down data signal (e.g., PD_B_1[3:0]) are both set to the power supply voltage 114 (e.g., VSS), the output signal $212_1$ (e.g., PAD_1) corresponds to the power supply voltage 114 (e.g., VSS). When the pull-up data signal (e.g., PU_1[3:0]) and the pull-down data signal (e.g., PD_B_1[3:0]) are both set to the core supply voltage (e.g., VDD), the output signal $212_1$ (e.g., PAD_1) corresponds to the power supply voltage 112 (e.g., VDDQ). Resistors 220, 222 and 224 represent routing wire resistance.

Figure 3:
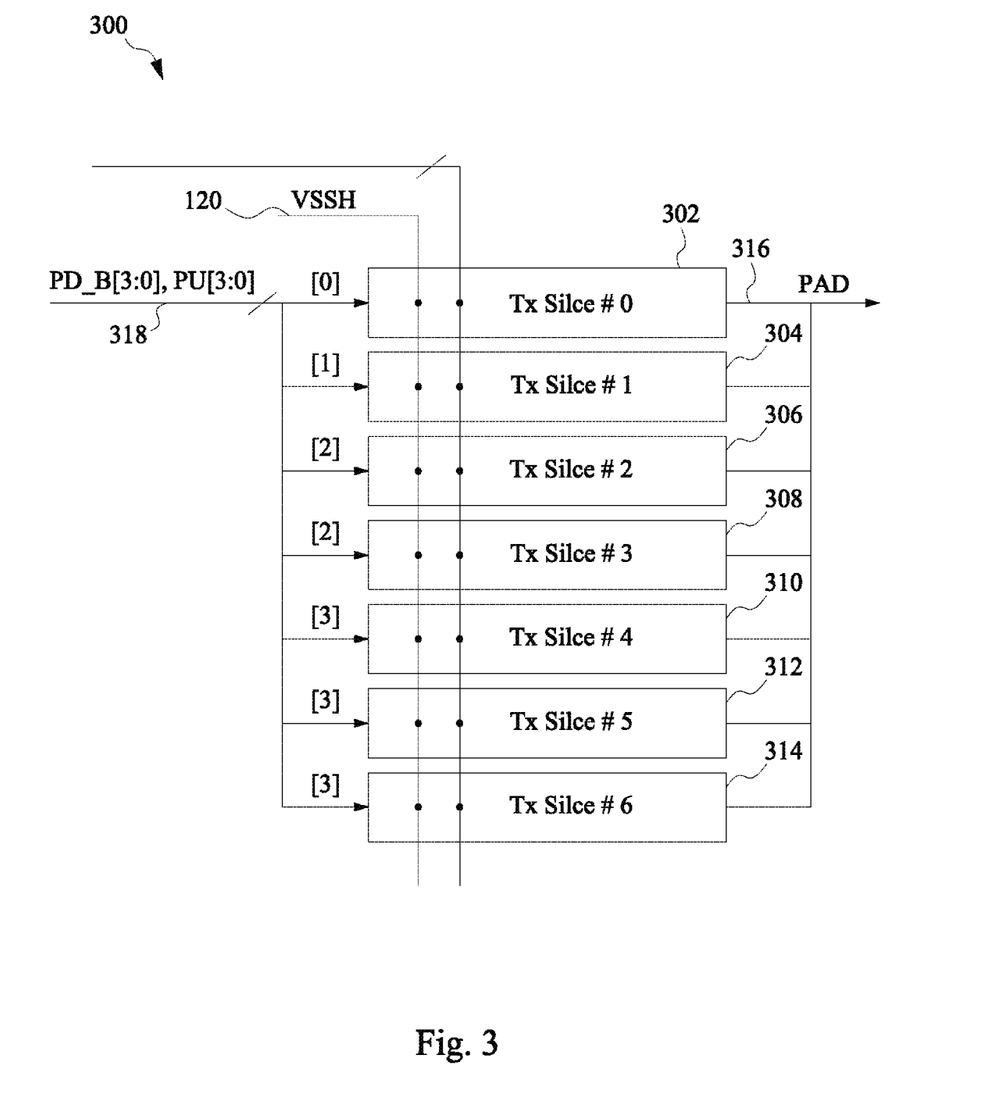
FIG. 3 depicts an example diagram of a transmitter, in accordance with some embodiments.

A transmitter (e.g., $206_1$) may include multiple transmission components. FIG. 3 depicts an example diagram of a transmitter, in accordance with some embodiments. As shown in FIG. 3, the transmitter 300 includes seven identical transmitter components 302, 304, 306, 308, 310, 312 and 314. Input data 318 that includes a pull-up data signal (e.g., PU[3:0]) and a pull-down data signal (e.g., PD_B[3:0]) is provided to the transmitter components which generate an output signal 316. For example, each transmission component corresponds to a resistance of 240 Ω, and the total resistance of the seven transmission components is about 34 Ω. More active transmission components may be included in the transmitter 300, which may result in lower on-resistance at an IO node associated with the output signal 316.

Referring back to FIG. 2, the ripple suppressor 202 includes a reservoir capacitor that is shared by all transmitters and thus needs to be large enough to sufficiently reduce potential ripples in the bias voltage 120 (e.g., VSSH). Instead of a large reservoir capacitor shared by all transmitters, a ripple suppressor may be implemented within each transmission component to locally reduce potential ripples.

Figure 4:
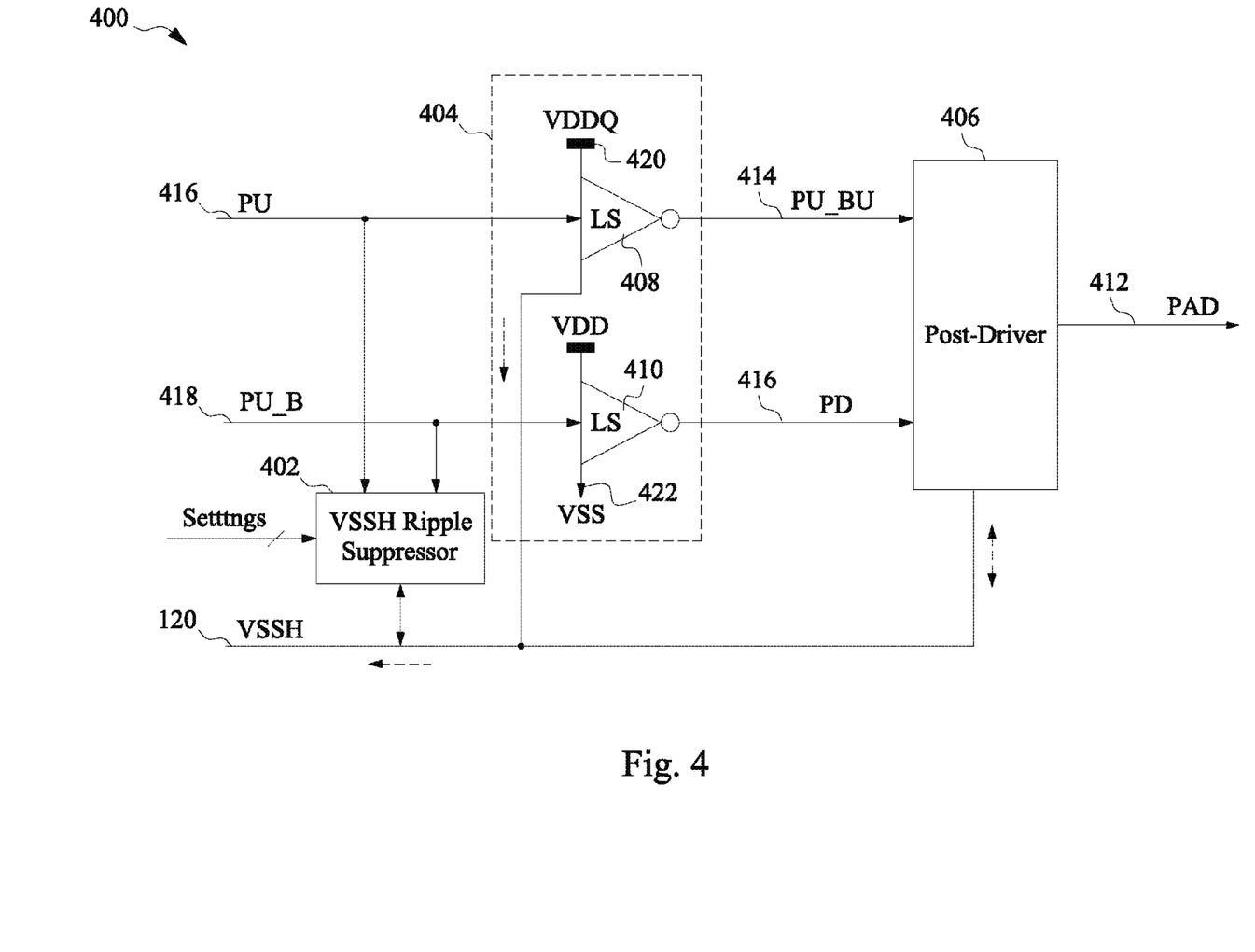
FIG. 4 depicts an example diagram of a transmission component as part of a transmitter, in accordance with some embodiments.
Figure 5:
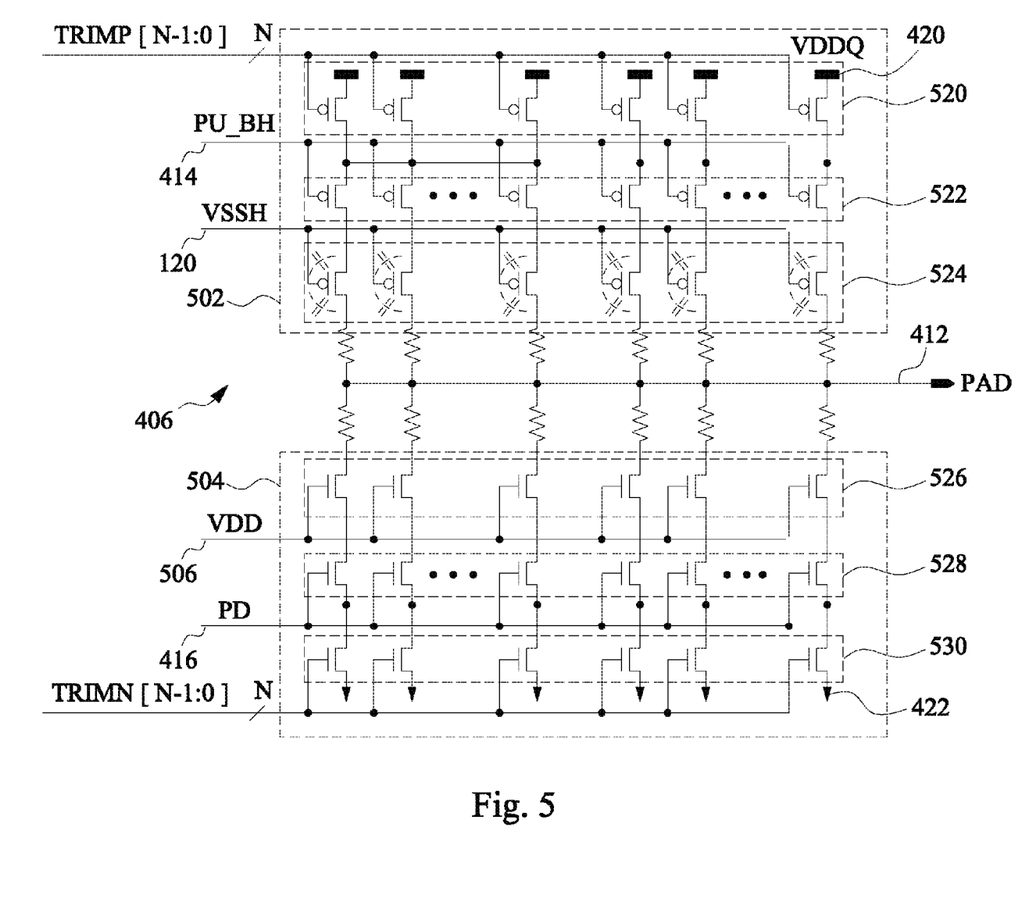
FIG. 5 depicts an example diagram of a post-driver circuit, in accordance with some embodiments.

FIG. 4 depicts an example diagram of a transmission component as part of a transmitter, in accordance with some embodiments. As shown in FIG. 4, a ripple suppressor 402 is implemented within the transmission component 400 for accurately maintaining the bias voltage 120 at a particular level. Specifically, the transmission component 400 includes a pre-driver circuit 404 and a post-driver circuit 406. The pre-driver circuit 404 includes two level shifters 408 and 410 which perform level-shifting for a pull-up signal 416 (e.g., PU) and a pull-down signal 418 (e.g., PD_B) respectively. The post-driver circuit 406 generates an output signal 412 based at least in part on level-shift signals 414 and 416, and an example of the post-driver circuit 406 is shown in FIG. 5. Currents associated with a bias generator (e.g., 204) may be consumed by the pre-driver circuit 404 and/or the post-driver circuit 406. Power supply voltages 420 and 422 are applied to the pre-driver circuit 404. For example, the power supply voltage 420 (e.g., VDDQ) satisfies the following formula:

$$VDDQ > 1.5 \times VDD$$

In some embodiments, switching activity in the pre-driver circuit 404 may cause ripples (e.g., uni-directional) in the bias voltage 120 (e.g., VSSH), which depend on the input data pattern. In certain embodiments, coupling in cascoded devices inside the post-driver circuit 406 may cause ripples (e.g., bi-directional) in the bias voltage 120 (e.g., VSSH), which depend on the voltage swing of the output signal 412.

FIG. 5 depicts an example diagram of a post-driver circuit, in accordance with some embodiments. As shown in FIG. 5, cascoded transistor networks 502 and 504 in the post-driver circuit 406 include cascoded P-type transistors (e.g., PMOS transistors) and cascoded N-type transistors (e.g., NMOS transistors), respectively. Specifically, the power supply voltage 420 (e.g., VDDQ) is applied to a first row of P-type transistors 520, and the level-shift signal 414 (e.g., PU_BH) is applied to gate terminals of a second row of P-type transistors 522. The bias voltage 120 is applied to gate terminals of a third row of P-type transistors 524. In addition, the power supply voltage 422 (e.g., VSS) is applied to a first row of N-type transistors 530, and the level-shift signal 416 (e.g., PD) is applied to gate terminals of a second row of N-type transistors 528. A core supply voltage 506 (e.g., VDD) is applied to gate terminals of a third row of N-type transistors 526.

Figure 6A:
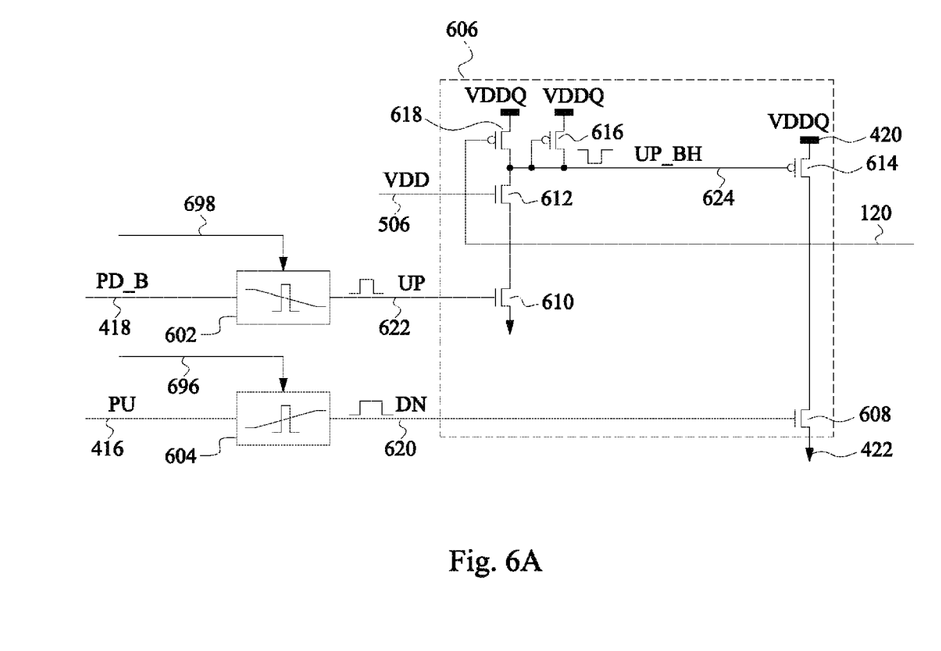
FIG. 6A depicts an example diagram of a ripple suppressor and FIG. 6B depicts an example timing diagram of certain signals related to the ripple suppressor, in accordance with some embodiments.
Figure 6B:
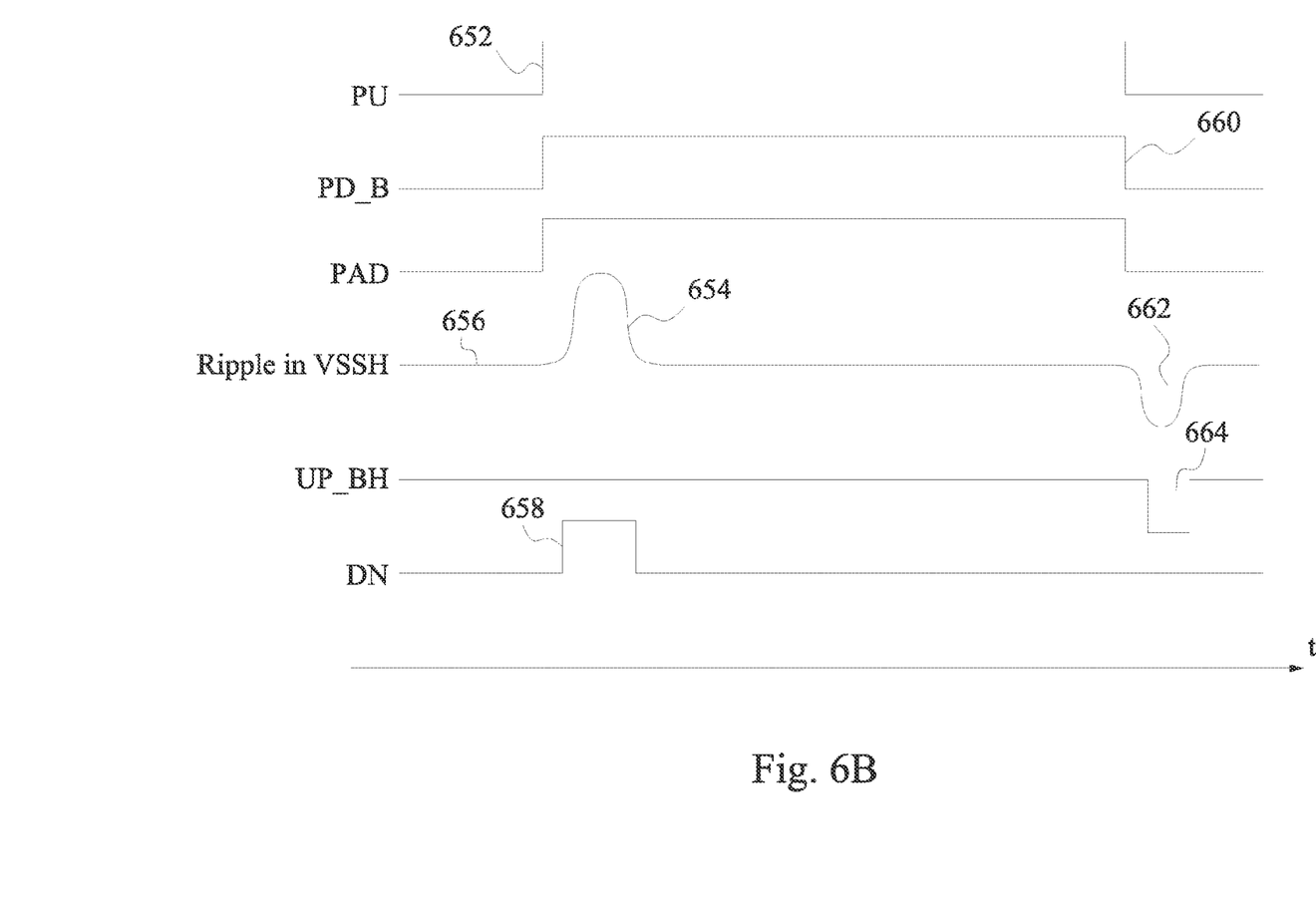

FIG. 6A depicts an example diagram of a ripple suppressor and FIG. 6B depicts an example timing diagram of certain signals related to the ripple suppressor, in accordance with some embodiments. As shown in FIG. 6A, the ripple suppressor 402 detects falling edges and/or rising edges in input data and generates pulses corresponding to the detected falling edges/rising edges to suppress ripples in the bias voltage 120.

Specifically, the ripple suppressor 402 includes a falling edge detector 602 for detecting falling edges in the pull-down signal 418 (e.g., PD_B), a rising edge detector 604 for detecting rising edges in the pull-up signal 416 (e.g., PU), and a transistor network 606. As shown in FIG. 6B, when a rising edge 652 appears in the pull-up signal 416 (e.g., PU), a ripple 654 may appear in the bias voltage 120 (e.g., VSSH), and the bias voltage 120 goes above a particular level 656. Correspondingly, the rising edge detector 604 generates a positive pulse 658 in a signal 620 (e.g., DN) which is applied to a gate terminal of a transistor 608. Thus, the bias voltage 120 is pulled down toward the power supply voltage 422 (e.g., VSS) to offset the ripple 654.

As shown in FIG. 6B, when a falling edge 660 appears in the pull-down signal 418 (e.g., PD_B), another ripple 662 may appear in the bias voltage 120 (e.g., VSSH) and the bias voltage 120 goes below the particular level 656. Correspondingly, the falling edge detector 602 generates a positive pulse in a signal 622 (e.g., UP) which is applied to a gate terminal of a transistor 610. Also, the core supply voltage 506 (e.g., VDD) is applied to a gate terminal of a transistor 612, and the bias voltage 120 (e.g., VSSH) is applied to a gate terminal of a transistor 618. As shown in FIG. 6B, a negative pulse 664 is generated in a signal 624 (e.g., UP_BH) which is applied to gate terminals of transistors 614 and 616. Thus, the bias voltage 120 is pulled up toward the power supply voltage 420 (e.g., VDDQ) to offset the ripple 662. In some embodiments, inputs 696 and 698 are provided to the rising edge detector 604 and the falling edge detector 602 respectively to set pulse widths of the pulses generated in the signals 622 and 620 based on the voltage swing of the output signal 412. For example, the bigger the voltage swing of the output signal 412, the larger the pulse widths of the pulses generated in the signals 622 and 620 for suppressing the ripples in the bias voltage 120 (e.g. VSSH).

Figure 7A:
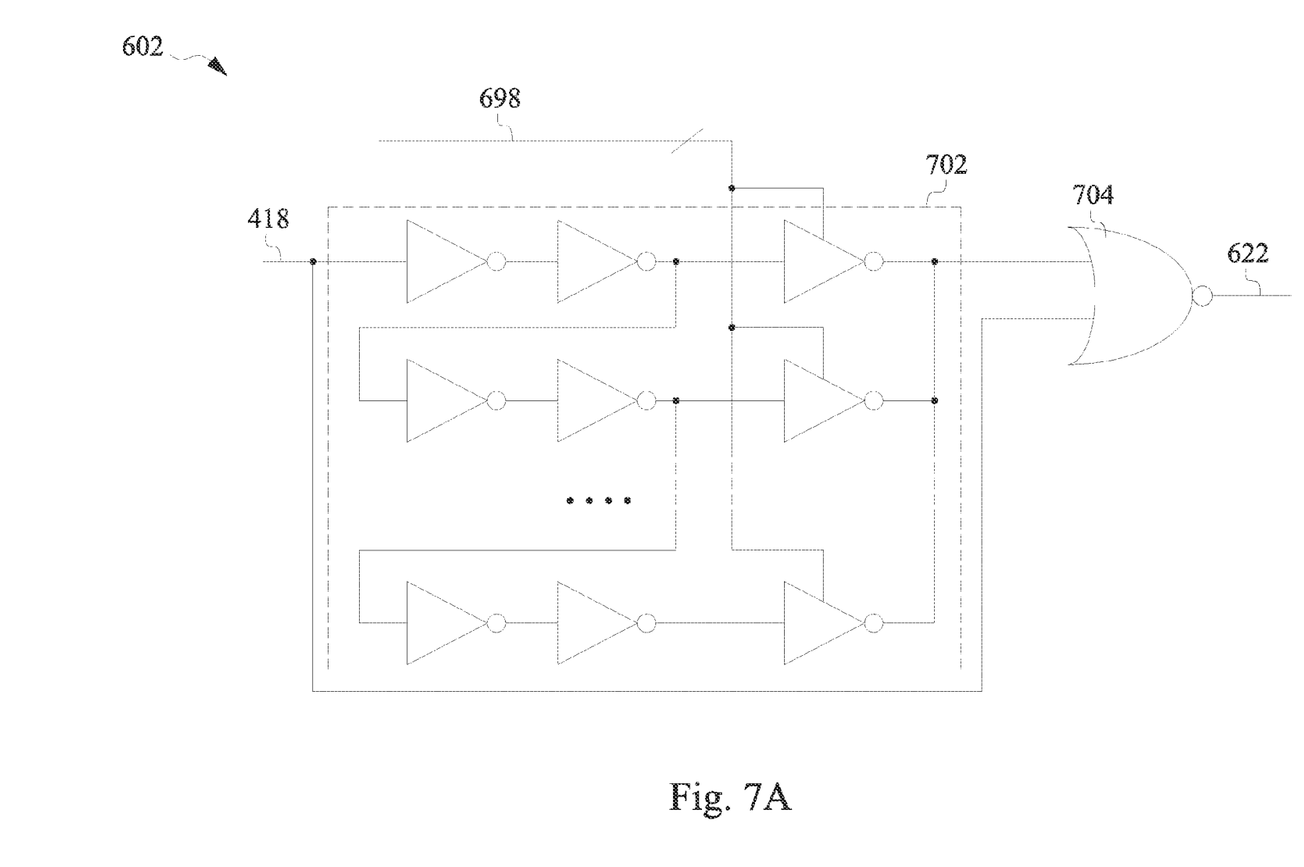
FIG. 7A depicts an example diagram of a falling edge detector and FIG. 7B depicts an example diagram of a rising edge detector, in accordance with some embodiments.
Figure 7B:
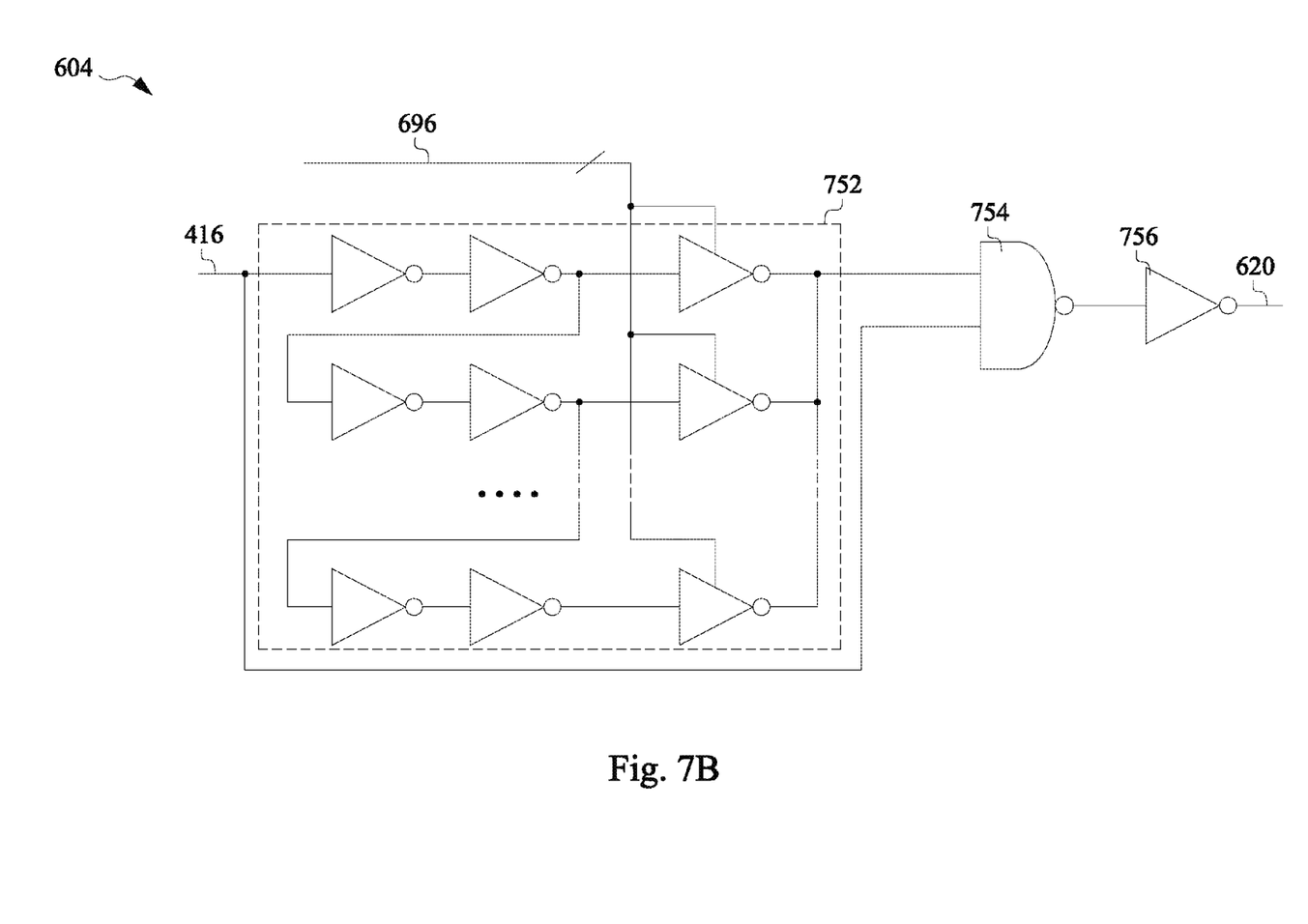

FIG. 7A depicts an example diagram of a falling edge detector and FIG. 7B depicts an example diagram of a rising edge detector, in accordance with some embodiments. As shown in FIG. 7A, the falling edge detector 602 includes a transistor network 702 connected with an NOR gate 704, and the transistor network 702 includes multiple NOT gates. As shown in FIG. 7B, the rising edge detector 604 includes a transistor network 752 connected with an NAND gate 754 and an NOT gate 756. The transistor network 752 includes multiple NOT gates. Any known structures of falling edge detectors and rising edge detectors may be implemented for the falling edge detector 602 and the rising edge detector 604, respectively.

Figure 8:
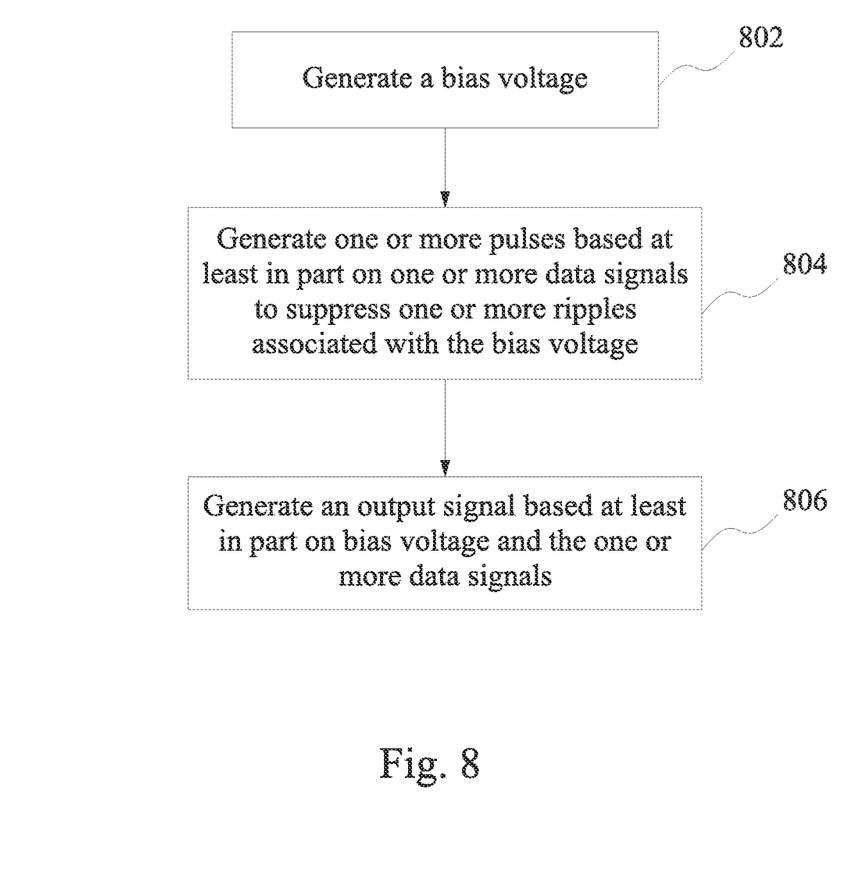
FIG. 8 depicts an example flow chart for bias-level correction, in accordance with some embodiments.

FIG. 8 depicts an example flow chart for bias-level correction, in accordance with some embodiments. As shown in FIG. 8, at 802, a bias voltage is generated (e.g., by the bias generator 204). At 804, one or more pulses are generated (e.g., by the ripple suppressor 402) based at least in part on one or more data signals to suppress one or more ripples associated with the bias voltage. At 806, an output signal is generated (e.g., by the transmission component 400) based at least in part on the bias voltage and the one or more data signals.

Figure 9:
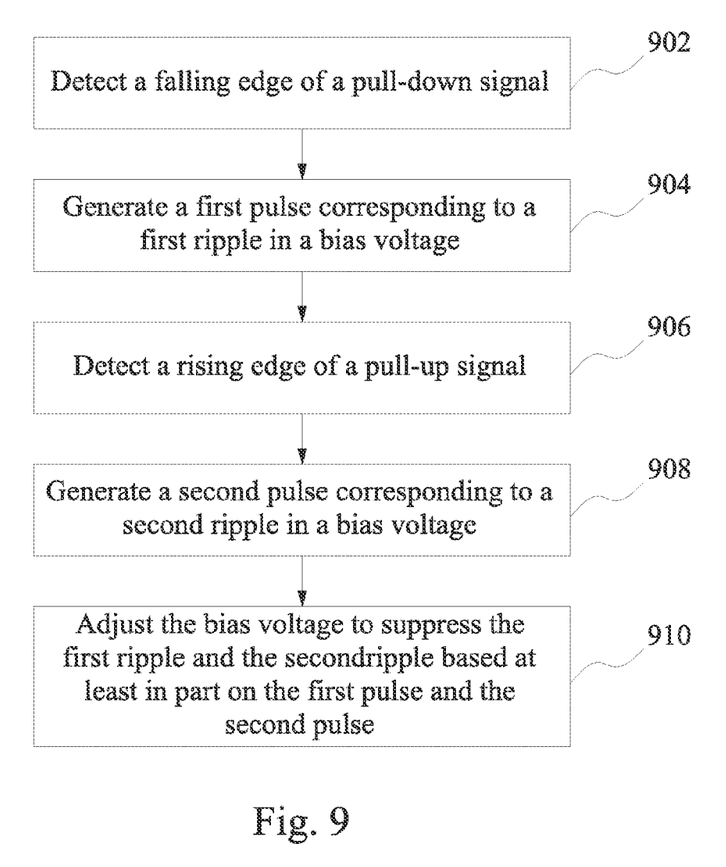
FIG. 9 depicts another example flow chart for bias-level correction, in accordance with some embodiments.

FIG. 9 depicts another example flow chart for bias-level correction, in accordance with some embodiments. As shown in FIG. 9, at 902, a falling edge of a pull-down signal is detected (e.g., by the falling edge detector 602). At 904, a first pulse corresponding to a first ripple is generated (e.g., by the falling edge detector 602) in a bias voltage. At 906, a rising edge of a pull-up signal is detected (e.g., by the rising edge detector 604). At 908, a second pulse corresponding to a second ripple is generated (e.g., by the rising edge detector 604) in the bias voltage. At 910, the bias voltage is adjusted (e.g., by the transistor network 606) to suppress the first ripple and the second ripple based at least in part on the first pulse and the second pulse.

According to one embodiment, an apparatus includes: a bias-voltage generator configured to generate a bias voltage; a first transmission component configured to receive the bias voltage and generate a first output signal based at least in part on the bias voltage and one or more first data signals; and a first bias-level correction component configured to generate one or more first pulses based at least in part on the one or more first data signals to suppress one or more ripples associated with the bias voltage.

According to another embodiment, a transmitter includes: a plurality of transmission components configured to receive a bias voltage and generate a plurality of output signals based at least in part on the bias voltage and one or more data signals; and a plurality of bias-level correction components configured to generate one or more pulses based at least in part on the one or more data signals to suppress one or more ripples associated with the bias voltage. A bias-voltage generator is configured to generate the bias voltage.

According to yet another embodiment, a bias-level correction component includes: a falling edge detector configured to detect a falling edge of a pull-down signal and generate a first pulse corresponding to a first ripple in a bias voltage; a rising edge detector configured to detect a rising edge of a pull-up signal and generate a second pulse corresponding to a second ripple in the bias voltage; and a ripple suppression component configured to adjust the bias voltage to suppress the first ripple and the second ripple based at least in part on the first pulse and the second pulse.

According to yet another embodiment, a method for bias-level correction includes: generating a bias voltage; generating one or more pulses based at least in part on one or more data signals to suppress one or more ripples associated with the bias voltage; and generating an output signal based at least in part on the bias voltage and the one or more data signals.

According to yet another embodiment, a method for bias-level correction includes: detecting a falling edge of a pull-down signal; generating a first pulse corresponding to a first ripple in a bias voltage; detecting a rising edge of a pull-up signal; generating a second pulse corresponding to a second ripple in the bias voltage; and adjusting the bias voltage to suppress the first ripple and the second ripple based at least in part on the first pulse and the second pulse.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a bias-voltage generator configured to generate a bias voltage;
   a first transmission component configured to receive the bias voltage and generate a first output signal based at least in part on the bias voltage and one or more first data signals; and
   a first bias-level correction component configured to generate one or more first pulses based at least in part on the one or more first data signals to suppress one or more ripples associated with the bias voltage;
   wherein:
      the one or more first data signals include a pull-down signal;
      the first bias-level correction component includes:
         a falling edge detector configured to detect a falling edge of the pull-down signal and generate a pulse of a pulse width corresponding to a first ripple in the bias voltage; and
         a ripple suppression component configured to adjust the bias voltage to suppress the first ripple based at least in part on the pulse.

2. The apparatus of claim 1, wherein the ripple suppression component includes a transistor network configured to pull the bias voltage up toward a high power-supply voltage in response to the pulse.

3. An apparatus comprising:
   a bias-voltage generator configured to generate a bias voltage;
   a first transmission component configured to receive the bias voltage and generate a first output signal based at least in part on the bias voltage and one or more first data signals; and
   a first bias-level correction component configured to generate one or more first pulses based at least in part on the one or more first data signals to suppress one or more ripples associated with the bias voltage;
   wherein:
      the one or more first data signals include a pull-up signal;

the first bias-level correction component includes:
a rising edge detector configured to detect a rising edge of the pull-up signal and generate a pulse of a pulse width corresponding to a first ripple in the bias voltage; and
a ripple suppression component configured to adjust the bias voltage to suppress the first ripple based at least in part on the pulse.

4. The apparatus of claim 3, wherein the ripple suppression component includes a transistor network configured to pull the bias voltage down toward a low power-supply voltage in response to the pulse.

5. An apparatus comprising:
a bias-voltage generator configured to generate a bias voltage;
a first transmission component configured to receive the bias voltage and generate a first output signal based at least in part on the bias voltage and one or more first data signals; and
a first bias-level correction component configured to generate one or more first pulses based at least in part on the one or more first data signals to suppress one or more ripples associated with the bias voltage;
wherein:
the one or more first data signals include a pull-down signal and a pull-up signal; the first bias-level correction component includes:
a falling edge detector configured to detect a falling edge of the pull-down signal and generate a first pulse corresponding to a first ripple in the bias voltage;
a rising edge detector configured to detect a rising edge of the pull-up signal and generate a second pulse corresponding to a second ripple in the bias voltage; and
a ripple suppression component configured to adjust the bias voltage to suppress the first ripple and the second ripple based at least in part on the first pulse and the second pulse.

6. The apparatus of claim 5, wherein the ripple suppression component includes:
a first transistor network configured to pull the bias voltage up toward a high power-supply voltage in response to the first pulse; and
a second transistor network configured to pull the bias voltage down toward a low power-supply voltage in response to the second pulse.

7. The apparatus of claim 5, wherein:
the first ripple corresponds to the bias voltage being below a value; and
the second ripple corresponds to the bias voltage being above the value.

8. The apparatus of claim 5, wherein:
a pulse width of the first pulse is related to a magnitude of the first ripple; and
a pulse width of the second pulse is related to a magnitude of the second ripple.

9. An apparatus comprising:
a bias-voltage generator configured to generate a bias voltage;
a first transmission component configured to receive the bias voltage and generate a first output signal based at least in part on the bias voltage and one or more first data signals, wherein the first transmission component includes:
a pre-driver circuit configured to generate one or more level-shift signals based at least in part on the one or more first data signals; and
a post-driver circuit configured to generate the first output signal based at least in part on the one or more level-shift signals; and
a first bias-level correction component configured to generate one or more first pulses based at least in part on the one or more first data signals to suppress one or more ripples associated with the bias voltage.

10. The apparatus of claim 9, wherein the pre-driver circuit includes one or more level-shifters configured to generate the one or more level-shift signals, the one or more ripples being associated with the one or more level-shifters.

11. The apparatus of claim 9, wherein:
the post-driver circuit includes a transistor network configured to generate the first output signal; and
the transistor network includes a plurality of cascode-connected transistors, the one or more ripples being associated with the plurality of cascode-connected transistors.

12. The apparatus of claim 11, wherein:
the one or more first data signals include a pull-down signal and a pull-up signal;
the plurality of cascode-connected transistors include a first transistor and a second transistor connected in cascode;
a gate voltage of the first transistor is associated with the pull-up signal; and
a gate voltage of the second transistor is associated with the bias voltage, the second transistor being operatively connected to an output node associated with the first output signal.

13. The apparatus of claim 12, wherein the first transistor and the second transistor are P-type transistors.

14. The apparatus of claim 12, wherein:
the plurality of cascode-connected transistors further include a third transistor and a fourth transistor connected in cascode;
a gate voltage of the third transistor is associated with the pull-down signal; and
a gate voltage of the fourth transistor is associated with a supply voltage, the fourth transistor being operatively connected to the output node.

15. The apparatus of claim 14, wherein the third transistor and the fourth transistor are N-type transistors.

16. An apparatus comprising:
a bias-voltage generator configured to generate a bias voltage;
a first transmission component configured to receive the bias voltage and generate a first output signal based at least in part on the bias voltage and one or more first data signals; and
a first bias-level correction component configured to generate one or more first pulses based at least in part on the one or more first data signals to suppress one or more ripples associated with the bias voltage;
wherein the first bias-level correction component is included in the first transmission component.

17. An apparatus comprising:
a bias-voltage generator configured to generate a bias voltage;
a first transmission component configured to receive the bias voltage and generate a first output signal based at least in part on the bias voltage and one or more first data signals;

a first bias-level correction component configured to generate one or more first pulses based at least in part on the one or more first data signals to suppress one or more ripples associated with the bias voltage;

a second transmission component configured to receive the bias voltage and generate a second output signal based at least in part on the bias voltage and one or more second data signals; and a second bias-level correction component configured to generate one or more second pulses based at least in part on the one or more second data signals for ripple suppression associated with the bias voltage.

18. A bias-level correction component comprising:

a falling edge detector configured to detect a falling edge of a pull-down signal and generate a first pulse corresponding to a first ripple in a bias voltage;

a rising edge detector configured to detect a rising edge of a pull-up signal and generate a second pulse corresponding to a second ripple in the bias voltage; and a ripple suppression component configured to adjust the bias voltage to suppress the first ripple and the second ripple based at least in part on the first pulse and the second pulse.

19. A method for bias-level correction, the method comprising:

detecting a falling edge of a pull-down signal;

generating a first pulse corresponding to a first ripple in a bias voltage;

detecting a rising edge of a pull-up signal;

generating a second pulse corresponding to a second ripple in the bias voltage; and adjusting the bias voltage to suppress the first ripple and the second ripple based at least in part on the first pulse and the second pulse.

20. The method of claim 19, further comprising:

pulling the bias voltage up toward a high power-supply voltage in response to the first pulse; and pulling the bias voltage down toward a low power-supply voltage in response to the first pulse.

* * * * *